(12) United States Patent
Das et al.

(10) Patent No.: US 11,537,242 B2
(45) Date of Patent: Dec. 27, 2022

(54) Q-FACTOR ENHANCEMENT IN RESONANT PHASE SENSING OF RESISTIVE-INDUCTIVE-CAPACITIVE SENSORS

(71) Applicant: Cirrus Logic International Semiconductor Ltd., Edinburgh (GB)

(72) Inventors: Tejasvi Das, Austin, TX (US); Siddharth Maru, Austin, TX (US); Zhong You, Austin, TX (US); Luke Lapointe, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 400 days.

(21) Appl. No.: 16/294,217

(22) Filed: Mar. 6, 2019

(65) Prior Publication Data

US 2019/0302922 A1 Oct. 3, 2019

Related U.S. Application Data

(60) Provisional application No. 62/739,970, filed on Oct. 2, 2018, provisional application No. 62/740,014, filed
(Continued)

(51) Int. Cl.
  *G06F 3/044* (2006.01)
  *G06F 3/045* (2006.01)
  *G06F 3/041* (2006.01)

(52) U.S. Cl.
  CPC .............. *G06F 3/044* (2013.01); *G06F 3/045* (2013.01); *G06F 3/0416* (2013.01)

(58) Field of Classification Search
  CPC ........ G06F 3/044; G06F 3/045; G06F 3/0416; H03K 17/9537
  See application file for complete search history.

(56) References Cited

U.S. PATENT DOCUMENTS 4,268,822 A   5/1981   Olsen
4,888,554 A   12/1989  Hyde et al.
(Continued)

FOREIGN PATENT DOCUMENTS

CN    10542884 A1   3/2016
CN    106471708 A   3/2017
(Continued)

OTHER PUBLICATIONS

International Search Report and Written Opinion of the International Searching Authority, International Application No. PCT/US2019/022518, dated May 24, 2019.
(Continued)

*Primary Examiner* — Roberto W Flores
(74) *Attorney, Agent, or Firm* — Jackson Walker L.L.P.

(57) ABSTRACT

A system may include a resistive-inductive-capacitive sensor, a measurement circuit communicatively coupled to the resistive-inductive-capacitive sensor and configured to measure phase information associated with the resistive-inductive-capacitive sensor and based on the phase information, determine a displacement of a mechanical member relative to the resistive-inductive-capacitive sensor. The system may also include a Q factor enhancer communicatively coupled to the resistive-inductive-capacitive sensor and configured to control a Q factor of the resistive-inductive-capacitive sensor.

20 Claims, 5 Drawing Sheets

Related U.S. Application Data on Oct. 2, 2018, provisional application No. 62/721,134, filed on Aug. 22, 2018, provisional application No. 62/649,857, filed on Mar. 29, 2018.

(56) References Cited

U.S. PATENT DOCUMENTS

| | | |
|---|---|---|
| 5,286,941 A | 2/1994 | Bel |
| 5,361,184 A | 11/1994 | El-Sharkawi et al. |
| 5,898,136 A | 4/1999 | Katsurahira |
| 6,231,520 B1 | 5/2001 | Maezawa |
| 6,473,708 B1 | 10/2002 | Watkins et al. |
| 7,173,410 B1 | 2/2007 | Pond |
| 8,144,126 B2 | 3/2012 | Wright |
| 8,384,378 B2 | 2/2013 | Feldkamp et al. |
| 8,421,446 B2 | 4/2013 | Straubinger et al. |
| 8,674,950 B2 | 3/2014 | Olson |
| 8,970,230 B2 | 3/2015 | Narayanasamy et al. |
| 9,070,856 B1 | 6/2015 | Rose et al. |
| 9,164,605 B1 | 10/2015 | Pirogov et al. |
| 9,707,502 B1 | 7/2017 | Bonifas et al. |
| 10,571,307 B2 | 2/2020 | Acker |
| 10,599,247 B2 | 3/2020 | Winokur et al. |
| 10,624,691 B2 | 4/2020 | Wiender et al. |
| 11,294,503 B2 | 4/2022 | Westerman |
| 2001/0045941 A1 | 11/2001 | Rosenberg et al. |
| 2003/0038624 A1 | 2/2003 | Hilliard et al. |
| 2005/0258826 A1 | 11/2005 | Kano et al. |
| 2005/0283330 A1 | 12/2005 | Laraia et al. |
| 2006/0293864 A1 | 12/2006 | Soss |
| 2007/0047634 A1 | 3/2007 | Kang et al. |
| 2007/0198926 A1 | 8/2007 | Joguet et al. |
| 2007/0268265 A1 | 11/2007 | XiaoPing |
| 2007/0296593 A1 | 12/2007 | Hall et al. |
| 2007/0296709 A1 | 12/2007 | GuangHai |
| 2008/0007534 A1 | 1/2008 | Peng et al. |
| 2008/0024456 A1 | 1/2008 | Peng et al. |
| 2008/0088594 A1 | 4/2008 | Liu et al. |
| 2008/0088595 A1 | 4/2008 | Liu et al. |
| 2008/0142352 A1 | 6/2008 | Wright |
| 2008/0143681 A1 | 6/2008 | XiaoPing |
| 2008/0150905 A1 | 6/2008 | Grivna et al. |
| 2008/0158185 A1 | 7/2008 | Westerman |
| 2009/0008161 A1 | 1/2009 | Jones et al. |
| 2009/0058430 A1 | 3/2009 | Zhu |
| 2009/0140728 A1 | 6/2009 | Rollins et al. |
| 2009/0278685 A1 | 11/2009 | Potyrailo et al. |
| 2009/0302868 A1 | 12/2009 | Feucht et al. |
| 2009/0308155 A1 | 12/2009 | Zhang |
| 2010/0019777 A1 | 1/2010 | Balslink |
| 2010/0045360 A1 | 2/2010 | Howard et al. |
| 2010/0153845 A1 | 6/2010 | Gregorio et al. |
| 2010/0211902 A1* | 8/2010 | Unsworth ............ G06F 3/03545 |
| | | 715/769 |
| 2010/0231239 A1 | 9/2010 | Tateishi et al. |
| 2010/0238121 A1 | 9/2010 | Ely |
| 2010/0328249 A1 | 12/2010 | Ningrat et al. |
| 2011/0005090 A1 | 1/2011 | Lee et al. |
| 2011/0214481 A1 | 9/2011 | Kachanov et al. |
| 2011/0216311 A1 | 9/2011 | Kachanov et al. |
| 2011/0267302 A1* | 11/2011 | Fasshauer ............. G06F 3/0414 |
| | | 345/174 |
| 2011/0285667 A1 | 11/2011 | Poupyrev et al. |
| 2011/0291821 A1 | 12/2011 | Chung |
| 2011/0301876 A1 | 12/2011 | Yamashita |
| 2013/0018489 A1 | 1/2013 | Grunthaner et al. |
| 2013/0076374 A1 | 3/2013 | Huang |
| 2013/0106756 A1 | 5/2013 | Kono et al. |
| 2013/0106769 A1 | 5/2013 | Bakken et al. |
| 2013/0269446 A1 | 10/2013 | Fukushima et al. |
| 2014/0002113 A1 | 1/2014 | Schediwy et al. |
| 2014/0028327 A1 | 1/2014 | Potyrailo et al. |
| 2014/0137585 A1 | 5/2014 | Lu et al. |
| 2014/0225599 A1 | 8/2014 | Hess |
| 2014/0267065 A1 | 9/2014 | Levesque |
| 2015/0022174 A1 | 1/2015 | Nikitin |
| 2015/0027139 A1 | 1/2015 | Lin et al. |
| 2015/0077094 A1 | 3/2015 | Baldwin et al. |
| 2015/0084874 A1 | 3/2015 | Cheng et al. |
| 2015/0329199 A1 | 11/2015 | Golborne et al. |
| 2016/0018940 A1* | 1/2016 | Lo ........................ G06F 3/0416 |
| | | 345/174 |
| 2016/0048256 A1 | 2/2016 | Day |
| 2016/0117084 A1 | 4/2016 | Ording |
| 2016/0162031 A1 | 6/2016 | Westerman et al. |
| 2016/0169717 A1 | 6/2016 | Zhitomirsky |
| 2016/0179243 A1 | 6/2016 | Schwartz |
| 2016/0241227 A1 | 8/2016 | Hirata |
| 2016/0252403 A1 | 9/2016 | Murakami |
| 2016/0357296 A1 | 12/2016 | Picciiotto et al. |
| 2017/0093222 A1 | 3/2017 | Joye et al. |
| 2017/0097437 A1 | 4/2017 | Widmer et al. |
| 2017/0147068 A1 | 5/2017 | Yamazaki et al. |
| 2017/0168578 A1 | 6/2017 | Tsukamoto et al. |
| 2017/0184416 A1 | 6/2017 | Kohlenberg et al. |
| 2017/0185173 A1 | 6/2017 | Ito et al. |
| 2017/0187541 A1 | 6/2017 | Sundaresan et al. |
| 2017/0237293 A1 | 8/2017 | Faraone et al. |
| 2017/0282715 A1 | 10/2017 | Fung et al. |
| 2017/0322643 A1 | 11/2017 | Eguchi |
| 2017/0328740 A1 | 11/2017 | Widmer et al. |
| 2017/0371380 A1* | 12/2017 | Oberhauser .......... G06F 1/1692 |
| 2017/0371381 A1* | 12/2017 | Liu ...................... G06F 1/1692 |
| 2017/0371473 A1* | 12/2017 | David .................. G06F 3/0416 |
| 2018/0019722 A1 | 1/2018 | Birkbeck |
| 2018/0055448 A1 | 3/2018 | Karakaya et al. |
| 2018/0059793 A1 | 3/2018 | Hajati |
| 2018/0088064 A1 | 3/2018 | Potyrailo et al. |
| 2018/0088702 A1 | 3/2018 | Schutzberg et al. |
| 2018/0182212 A1 | 6/2018 | Li et al. |
| 2018/0183372 A1 | 6/2018 | Li et al. |
| 2018/0195881 A1 | 7/2018 | Acker |
| 2018/0221796 A1 | 8/2018 | Bonifas et al. |
| 2018/0229161 A1 | 8/2018 | Maki et al. |
| 2018/0231485 A1 | 8/2018 | Potyrailo et al. |
| 2018/0260049 A1 | 9/2018 | O'Lionaird et al. |
| 2018/0260050 A1 | 9/2018 | Unseld et al. |
| 2018/0321748 A1 | 11/2018 | Rao et al. |
| 2019/0235629 A1 | 8/2019 | Hu et al. |
| 2019/0286263 A1 | 9/2019 | Bagheri et al. |
| 2019/0302161 A1 | 10/2019 | You et al. |
| 2019/0302193 A1 | 10/2019 | Maru et al. |
| 2019/0302890 A1 | 10/2019 | Marijanovic et al. |
| 2019/0302922 A1 | 10/2019 | Das et al. |
| 2019/0302923 A1 | 10/2019 | Maru et al. |
| 2019/0326906 A1 | 10/2019 | Camacho Cardenas et al. |
| 2019/0339313 A1 | 11/2019 | Vandermeijden |
| 2020/0064952 A1 | 1/2020 | Siemieniec et al. |
| 2020/0177290 A1 | 6/2020 | Reimer et al. |
| 2020/0191761 A1 | 6/2020 | Potyrailo et al. |
| 2020/0320966 A1 | 10/2020 | Clark et al. |
| 2020/0373923 A1 | 11/2020 | Walsh et al. |
| 2021/0361940 A1 | 11/2021 | Yeh et al. |
| 2022/0075500 A1 | 3/2022 | Chang et al. |
| 2022/0268233 A1 | 8/2022 | Kennedy et al. |

FOREIGN PATENT DOCUMENTS

| | | |
|---|---|---|
| CN | 107076623 A | 8/2017 |
| CN | 209069345 U | 7/2019 |
| DE | 4004450 A1 | 8/1991 |
| DE | 602004005672 T2 | 12/2007 |
| DE | 102015215330 A1 | 2/2017 |
| DE | 102015215331 A1 | 2/2017 |
| EP | 1697710 B1 | 4/2007 |
| EP | 2682843 A1 | 1/2014 |
| GB | 2394295 A | 4/2004 |
| GB | 2573644 A | 11/2019 |
| JP | 2006246289 A | 9/2006 |
| KR | 20130052059 A1 | 5/2013 |
| WO | 00/33244 A2 | 6/2000 |
| WO | 20061354832 A2 | 12/2006 |

(56) References Cited

FOREIGN PATENT DOCUMENTS

| WO | 2007068283 A1 | 6/2007 |
|---|---|---|
| WO | 2016032704 A1 | 3/2016 |

OTHER PUBLICATIONS

International Search Report and Written Opinion of the International Searching Authority, International Application No. PCT/US2019/022578, dated May 27, 2019.
International Search Report and Written Opinion of the International Searching Authority, International Application No. PCT/US2019/021838, dated May 27, 2019.
International Search Report and Written Opinion of the International Searching Authority, International Application No. PCT/US2019/045554, dated Oct. 17, 2019.
Combined Search and Examination Report, UKIPO, Application No. GB1904250.6, dated Sep. 10, 2019.
Combined Search and Examination Report under Sections 17 and 18(3), UKIPO, Application No. GB2001341.3, dated Jun. 29, 2020.
First Office Action, China National Intellectual Property Administration, Application No. 201980022689.9, dated Jun. 2, 2021.
First Office Action, China National Intellectual Property Administration, Application No. 201980022693.5, dated Jul. 8, 2021.
International Search Report and Written Opinion of the International Searching Authority, International Application No. PCT/US2020/059113, dated Feb. 23, 2021.
International Search Report and Written Opinion of the International Searching Authority, International Application No. PCT/US2020/059101, dated Mar. 9, 2021.
Combined Search and Examination Report under Sections 17 and 18(3), UKIPO, Application No. GB2111666.0, dated Feb. 11, 2022.
Examination Report under Section 18(3), UKIPO, Application No. GB2101804.9, dated Feb. 25, 2022.
International Search Report and Written Opinion of the International Searching Authority, International Application No. PCT/US2022/012721, dated Apr. 26, 2022.
Second Office Action, China National Intellectual Property Administration, Application No. 201980022693.5, dated Apr. 13, 2022.
Examination Report under Section 18(3), UKIPO, Application No. GB2015439.9, dated May 10, 2022.
International Search Report and Written Opinion of the International Searching Authority, International Application No. PCT/US2022/018886, dated Jun. 10, 2022.
Combined Search and Examination Report under Sections 17 and 18(3), UKIPO, Application No. GB2201194.4, dated Jul. 1, 2022.
Intellectual Search Report and Written Opinion of the International Searching Authority, International Application No. PCT/US2022/018475, dated Aug. 2, 2022.
First Office Action, China National Intellectual Property Administration, Application No. 202010105829.3, dated Apr. 12, 2022, received by counsel Jul. 28, 2022.
Notice of Preliminary Rejection, Korean Intellectual Property Office, Application No. 10-2020-7029597, dated Jul. 29, 2022.

\* cited by examiner

Q-FACTOR ENHANCEMENT IN RESONANT PHASE SENSING OF RESISTIVE-INDUCTIVE-CAPACITIVE SENSORS

RELATED APPLICATION

The present disclosure claims priority to U.S. Provisional Patent Application Ser. No. 62/739,970, filed Oct. 2, 2018, U.S. Provisional Patent Application Ser. No. 62/649,857, filed Mar. 29, 2018, U.S. Provisional Patent Application Ser. No. 62/721,134, filed Aug. 22, 2018, and U.S. Provisional Patent Application Ser. No. 62/740,014, filed Oct. 2, 2018, all of which are incorporated by reference herein in their entireties.

FIELD OF DISCLOSURE

The present disclosure relates in general to electronic devices with user interfaces, (e.g., mobile devices, game controllers, instrument panels, etc.), and more particularly, resonant phase sensing of resistive-inductive-capacitive sensors for use in a system for mechanical button replacement in a mobile device, and/or other suitable applications.

BACKGROUND

Many traditional mobile devices (e.g., mobile phones, personal digital assistants, video game controllers, etc.) include mechanical buttons to allow for interaction between a user of a mobile device and the mobile device itself. However, because such mechanical buttons are susceptible to aging, wear, and tear that may reduce the useful life of a mobile device and/or may require significant repair if malfunction occurs, mobile device manufacturers are increasingly looking to equip mobile devices with virtual buttons that act as a human-machine interface allowing for interaction between a user of a mobile device and the mobile device itself. Ideally, for best user experience, such virtual buttons should look and feel to a user as if a mechanical button were present instead of a virtual button.

Presently, linear resonant actuators (LRAs) and other vibrational actuators (e.g., rotational actuators, vibrating motors, etc.) are increasingly being used in mobile devices to generate vibrational feedback in response to user interaction with human-machine interfaces of such devices. Typically, a sensor (traditionally a force or pressure sensor) detects user interaction with the device (e.g., a finger press on a virtual button of the device) and in response thereto, the linear resonant actuator may vibrate to provide feedback to the user. For example, a linear resonant actuator may vibrate in response to user interaction with the human-machine interface to mimic to the user the feel of a mechanical button click.

However, there is a need in the industry for sensors to detect user interaction with a human-machine interface, wherein such sensors provide acceptable levels of sensor sensitivity, power consumption, and size.

SUMMARY

In accordance with the teachings of the present disclosure, the disadvantages and problems associated with sensing of human-machine interface interactions in a mobile device may be reduced or eliminated.

In accordance with embodiments of the present disclosure, a system may include a resistive-inductive-capacitive sensor, a measurement circuit communicatively coupled to the resistive-inductive-capacitive sensor and configured to measure phase information associated with the resistive-inductive-capacitive sensor and based on the phase information, determine a displacement of a mechanical member relative to the resistive-inductive-capacitive sensor. The system may also include a Q factor enhancer communicatively coupled to the resistive-inductive-capacitive sensor and configured to control a Q factor of the resistive-inductive-capacitive sensor.

In accordance with these and other embodiments of the present disclosure, a method may include measuring phase information associated with the resistive-inductive-capacitive sensor, based on the phase information, determining a displacement of a mechanical member relative to the resistive-inductive-capacitive sensor, and controlling a Q factor of the resistive-inductive-capacitive sensor with a Q factor enhancer communicatively coupled to the resistive-inductive-capacitive sensor.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

Each of FIGS. 4A-4C illustrates a diagram of selected components of an example resonant phase sensing system, in accordance with embodiments of the present disclosure.

DETAILED DESCRIPTION

Figure 1:
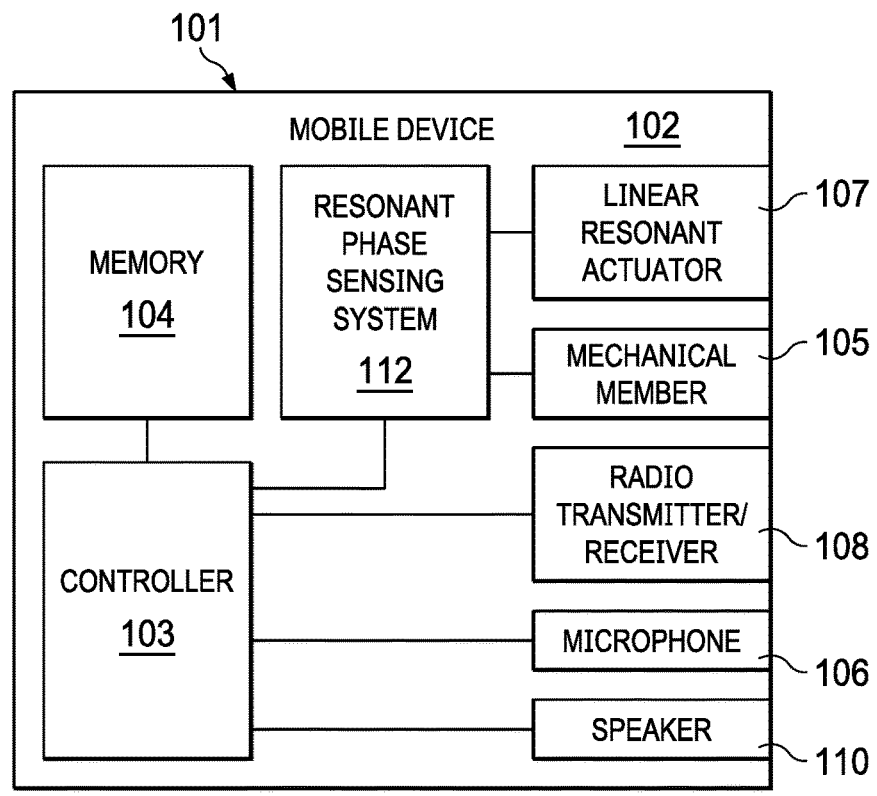
FIG. 1 illustrates a block diagram of selected components of an example mobile device, in accordance with embodiments of the present disclosure.

FIG. 1 illustrates a block diagram of selected components of an example mobile device 102, in accordance with embodiments of the present disclosure. As shown in FIG. 1, mobile device 102 may comprise an enclosure 101, a controller 103, a memory 104, a mechanical member 105, a microphone 106, a linear resonant actuator 107, a radio transmitter/receiver 108, a speaker 110, and a resonant phase sensing system 112.

Enclosure 101 may comprise any suitable housing, casing, or other enclosure for housing the various components of mobile device 102. Enclosure 101 may be constructed from plastic, metal, and/or any other suitable materials. In addition, enclosure 101 may be adapted (e.g., sized and shaped) such that mobile device 102 is readily transported on a person of a user of mobile device 102. Accordingly, mobile device 102 may include but is not limited to a smart phone, a tablet computing device, a handheld computing device, a personal digital assistant, a notebook computer, a video game controller, or any other device that may be readily transported on a person of a user of mobile device 102.

Controller 103 may be housed within enclosure 101 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, controller 103 may interpret and/or execute program instructions and/or process data stored in memory 104 and/or other computer-readable media accessible to controller 103.

Memory 104 may be housed within enclosure 101, may be communicatively coupled to controller 103, and may include any system, device, or apparatus configured to retain program instructions and/or data for a period of time (e.g., computer-readable media). Memory 104 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 102 is turned off.

Microphone 106 may be housed at least partially within enclosure 101, may be communicatively coupled to controller 103, and may comprise any system, device, or apparatus configured to convert sound incident at microphone 106 to an electrical signal that may be processed by controller 103, wherein such sound is converted to an electrical signal using a diaphragm or membrane having an electrical capacitance that varies based on sonic vibrations received at the diaphragm or membrane. Microphone 106 may include an electrostatic microphone, a condenser microphone, an electret microphone, a microelectromechanical systems (MEMs) microphone, or any other suitable capacitive microphone.

Radio transmitter/receiver 108 may be housed within enclosure 101, may be communicatively coupled to controller 103, and may include any system, device, or apparatus configured to, with the aid of an antenna, generate and transmit radio-frequency signals as well as receive radio-frequency signals and convert the information carried by such received signals into a form usable by controller 103. Radio transmitter/receiver 108 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

A speaker 110 may be housed at least partially within enclosure 101 or may be external to enclosure 101, may be communicatively coupled to controller 103, and may comprise any system, device, or apparatus configured to produce sound in response to electrical audio signal input. In some embodiments, a speaker may comprise a dynamic loudspeaker, which employs a lightweight diaphragm mechanically coupled to a rigid frame via a flexible suspension that constrains a voice coil to move axially through a cylindrical magnetic gap. When an electrical signal is applied to the voice coil, a magnetic field is created by the electric current in the voice coil, making it a variable electromagnet. The voice coil and the driver's magnetic system interact, generating a mechanical force that causes the voice coil (and thus, the attached cone) to move back and forth, thereby reproducing sound under the control of the applied electrical signal coming from the amplifier.

Mechanical member 105 may be housed within or upon enclosure 101, and may include any suitable system, device, or apparatus configured such that all or a portion of mechanical member 105 displaces in position responsive to a force, a pressure, or a touch applied upon or proximately to mechanical member 105. In some embodiments, mechanical member 105 may be designed to appear as a mechanical button on the exterior of enclosure 101.

Linear resonant actuator 107 may be housed within enclosure 101, and may include any suitable system, device, or apparatus for producing an oscillating mechanical force across a single axis. For example, in some embodiments, linear resonant actuator 107 may rely on an alternating current voltage to drive a voice coil pressed against a moving mass connected to a spring. When the voice coil is driven at the resonant frequency of the spring, linear resonant actuator 107 may vibrate with a perceptible force. Thus, linear resonant actuator 107 may be useful in haptic applications within a specific frequency range. While, for the purposes of clarity and exposition, this disclosure is described in relation to the use of linear resonant actuator 107, it is understood that any other type or types of vibrational actuators (e.g., eccentric rotating mass actuators) may be used in lieu of or in addition to linear resonant actuator 107. In addition, it is also understood that actuators arranged to produce an oscillating mechanical force across multiple axes may be used in lieu of or in addition to linear resonant actuator 107. As described elsewhere in this disclosure, a linear resonant actuator 107, based on a signal received from resonant phase sensing system 112, may render haptic feedback to a user of mobile device 102 for at least one of mechanical button replacement and capacitive sensor feedback.

Together, mechanical member 105 and linear resonant actuator 107 may form a human-interface device, such as a virtual button, which, to a user of mobile device 102, has a look and feel of a mechanical button of mobile device 102.

Resonant phase sensing system 112 may be housed within enclosure 101, may be communicatively coupled to mechanical member 105 and linear resonant actuator 107, and may include any system, device, or apparatus configured to detect a displacement of mechanical member 105 indicative of a physical interaction (e.g., by a user of mobile device 102) with the human-machine interface of mobile device 102 (e.g., a force applied by a human finger to a virtual button of mobile device 102). As described in greater detail below, resonant phase sensing system 112 may detect displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105. Thus, mechanical member 105 may comprise any suitable system, device, or apparatus which all or a portion thereof may displace, and such displacement may cause a change in an impedance of a resistive-inductive-capacitive sensor integral to resonant phase sense system 112. Resonant phase sensing system 112 may also generate an electronic signal for driving linear resonant actuator 107 in response to a physical interaction associated with a human-machine interface associated with mechanical member 105. Detail of an example resonant phase sensing system 112 in accordance with embodiments of the present disclosure is depicted in greater detail below.

Although specific example components are depicted above in FIG. 1 as being integral to mobile device 102 (e.g., controller 103, memory 104, mechanical member 105, microphone 106, radio transmitter/receiver 108, speakers(s) 110, linear resonant actuator 107, etc.), a mobile device 102 in accordance with this disclosure may comprise one or more components not specifically enumerated above. For example, although FIG. 1 depicts certain user interface components, mobile device 102 may include one or more other user interface components in addition to those depicted in FIG. 1, including but not limited to a keypad, a touch screen, and a display, thus allowing a user to interact with and/or otherwise manipulate mobile device 102 and its associated components. In addition, although FIG. 1 depicts only a single virtual button comprising mechanical member 105 and linear resonant actuator 107 for purposes of clarity and exposition, in some embodiments a mobile device 102 may have multiple virtual buttons each comprising a respective mechanical member 105 and linear resonant actuator 107.

Although, as stated above, resonant phase sensing system 112 may detect displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105, in some embodiments resonant phase sensing system 112 may primarily detect displacement of mechanical member 105 by using resonant phase sensing to determine a change in an inductance of a resistive-inductive-capacitive sensor. For example, FIGS. 2 and 3 illustrate selected components of an example inductive sensing application that may be implemented by resonant phase sensing system 112, in accordance with embodiments of the present disclosure.

Figure 2:
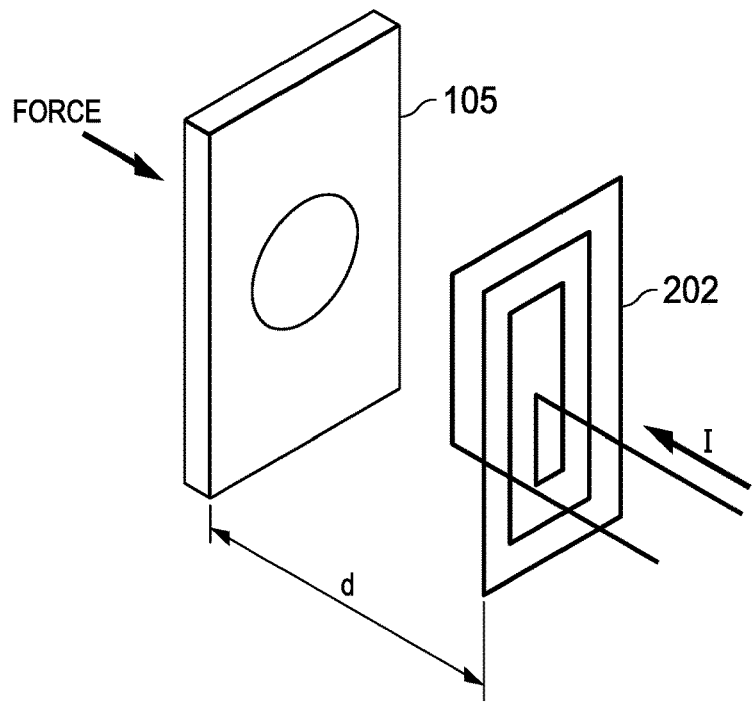
FIG. 2 illustrates a mechanical member separated by a distance from an inductive coil, in accordance with embodiments of the present disclosure.
Figure 3:
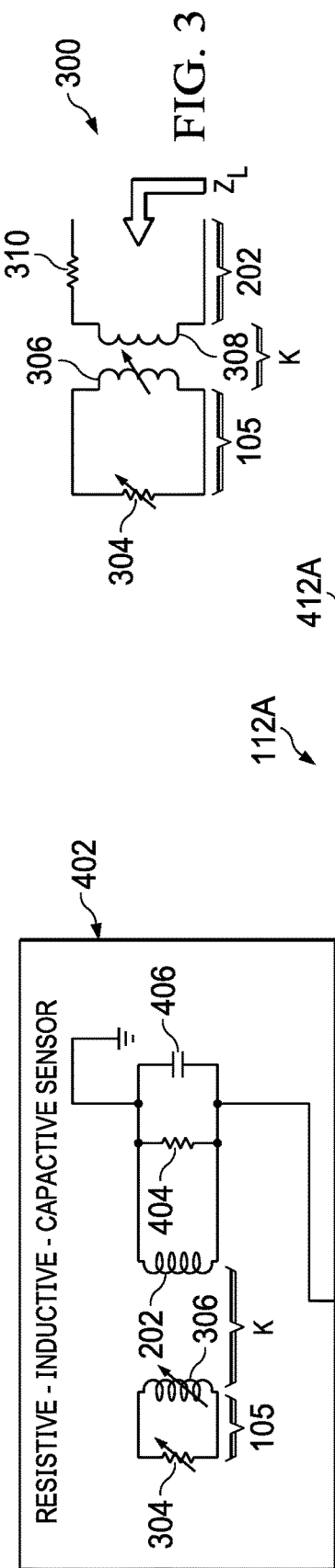
FIG. 3 illustrates selected components of an inductive sensing system that may be implemented by a resonant phase sensing system, in accordance with embodiments of the present disclosure.

FIG. 2 illustrates mechanical member 105 embodied as a metal plate separated by a distance d from an inductive coil 202, in accordance with embodiments of the present disclosure. FIG. 3 illustrates selected components of an inductive sensing system 300 that may be implemented by resonant phase sensing system 112, in accordance with embodiments of the present disclosure. As shown in FIG. 3, inductive sensing system 300 may include mechanical member 105, modeled as a variable electrical resistance 304 and a variable electrical inductance 306, and may include inductive coil 202 in physical proximity to mechanical member such that inductive coil 202 has a mutual inductance with mechanical member 105 defined by a variable coupling coefficient k. As shown in FIG. 3, inductive coil 202 may be modeled as a variable electrical inductance 308 and a variable electrical resistance 310.

In operation, as a current I flows through inductive coil 202, such current may induce a magnetic field which in turn may induce an eddy current inside mechanical member 105. When a force is applied to and/or removed from mechanical member 105, which alters distance d between mechanical member 105 and inductive coil 202, the coupling coefficient k, variable electrical resistance 304, and/or variable electrical inductance 306 may also change in response to the change in distance. These changes in the various electrical parameters may, in turn, modify an effective impedance $Z_L$ of inductive coil 202.

Figure 4A:
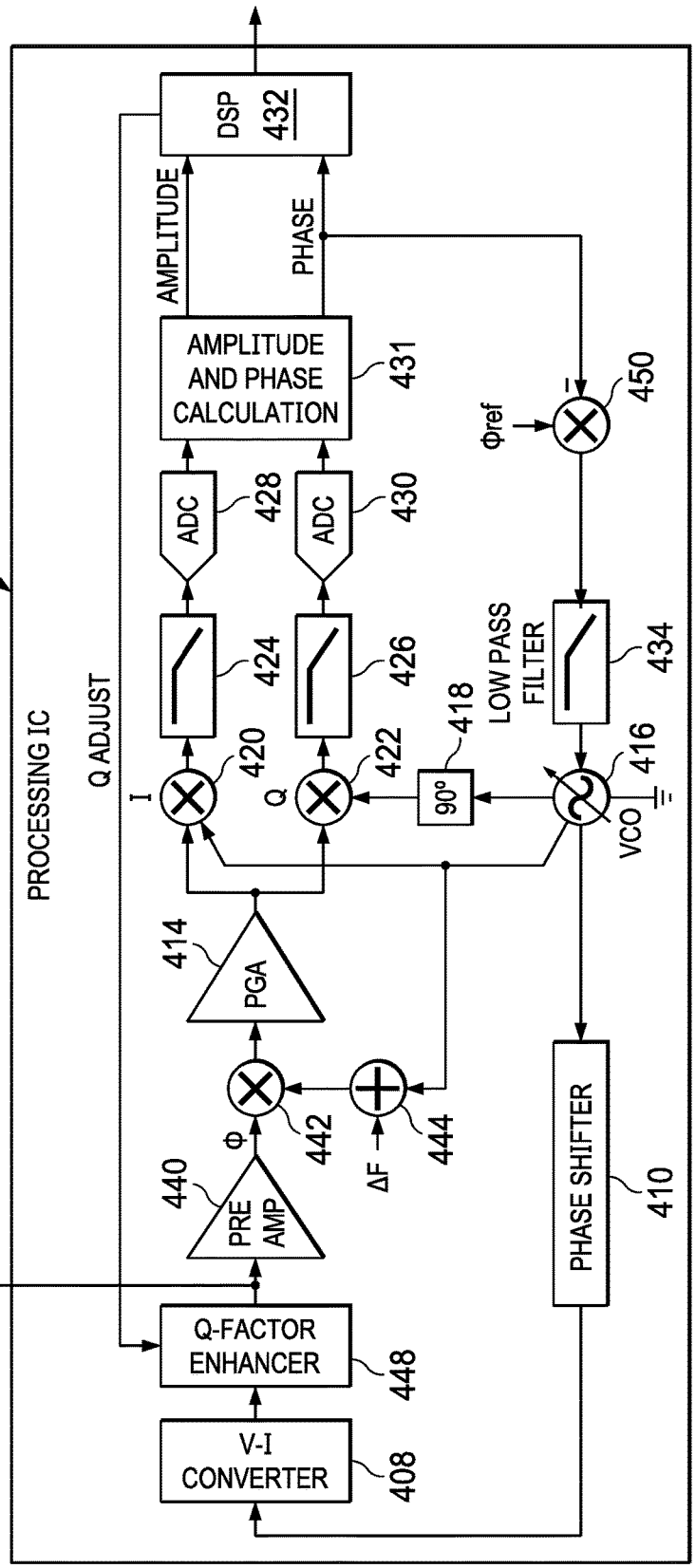

FIG. 4A illustrates a diagram of selected components of an example resonant phase sensing system 112A, in accordance with embodiments of the present disclosure. In some embodiments, resonant phase sensing system 112A may be used to implement resonant phase sensing system 112 of FIG. 1. As shown in FIG. 4A, resonant phase sensing system 112A may include a resistive-inductive-capacitive sensor 402 and a processing integrated circuit (IC) 412A.

As shown in FIG. 4A, resistive-inductive-capacitive sensor 402 may include mechanical member 105, inductive coil 202, a resistor 404, and capacitor 406, wherein mechanical member 105 and inductive coil 202 have a variable coupling coefficient k. Although shown in FIG. 4A to be arranged in parallel with one another, it is understood that inductive coil 202, resistor 404, and capacitor 406 may be arranged in any other suitable manner that allows resistive-inductive-capacitive sensor 402 to act as a resonant tank. For example, in some embodiments, inductive coil 202, resistor 404, and capacitor 406 may be arranged in series with one another. In some embodiments, resistor 404 may not be implemented with a stand-alone resistor, but may instead be implemented by a parasitic resistance of inductive coil 202, a parasitic resistance of capacitor 406, and/or any other suitable parasitic resistance.

Processing IC 412A may be communicatively coupled to resistive-inductive-capacitive sensor 402 and may comprise any suitable system, device, or apparatus configured to implement a measurement circuit to measure phase information associated with resistive-inductive-capacitive sensor 402 and based on the phase information, determine a displacement of mechanical member 105 relative to resistive-inductive-capacitive sensor 402. Thus, processing IC 412A may be configured to determine an occurrence of a physical interaction (e.g., press or release of a virtual button) associated with a human-machine interface associated with mechanical member 105 based on the phase information.

As shown in FIG. 4A, processing IC 412A may include a phase shifter 410, a voltage-to-current converter 408, a preamplifier 440, an intermediate frequency mixer 442, a combiner 444, a programmable gain amplifier (PGA) 414, a voltage-controlled oscillator (VCO) 416, a phase shifter 418, an amplitude and phase calculation block 431, a DSP 432, a low-pass filter 434, a combiner 450, and a Q-factor enhancer 448. Processing IC 412A may also include a coherent incident/quadrature detector implemented with an incident channel comprising a mixer 420, a low-pass filter 424, and an analog-to-digital converter (ADC) 428, and a quadrature channel comprising a mixer 422, a low-pass filter 426, and an ADC 430 such that processing IC 412A is configured to measure the phase information using the coherent incident/quadrature detector.

Phase shifter 410 may include any system, device, or apparatus configured to detect an oscillation signal generated by processing IC 412A (as explained in greater detail below) and phase shift such oscillation signal (e.g., by 45 degrees) such that a normal operating frequency of resonant phase sensing system 112A, an incident component of a sensor signal ϕ generated by pre-amplifier 440 is approximately equal to a quadrature component of sensor signal ϕ, so as to provide common mode noise rejection by a phase detector implemented by processing IC 412A, as described in greater detail below.

Voltage-to-current converter 408 may receive the phase shifted oscillation signal from phase shifter 410, which may be a voltage signal, convert the voltage signal to a corresponding current signal, and drive the current signal on resistive-inductive-capacitive sensor 402 at a driving frequency with the phase-shifted oscillation signal in order to generate sensor signal $\phi$ which may be processed by processing IC 412A, as described in greater detail below. In some embodiments, a driving frequency of the phase-shifted oscillation signal may be selected based on a resonant frequency of resistive-inductive-capacitive sensor 402 (e.g., may be approximately equal to the resonant frequency of resistive-inductive-capacitive sensor 402).

Q factor enhancer 448 may comprise any suitable system, device, or apparatus configured to, responsive to a control signal Q ADJUST received from DSP 432, control a Q factor associated with resistive-inductive-capacitive sensor 402. As is known in the art, a Q factor of an electronic device may provide a measure of the sensitivity of such device. Thus, in connection with resistive-inductive-capacitive sensor 402, the Q factor may comprise a measure of the amount of phase shift in sensor signal $\phi$ induced per unit of displacement of mechanical member 105. The Q factor for resistive-inductive-capacitive sensor 402 may be given by: $Q=\sqrt{L}/R\sqrt{C}$, where R is a resistance of resistive-inductive-capacitive sensor 402, L is an inductance of resistive-inductive-capacitive sensor 402, and C is a capacitance of resistive-inductive-capacitive sensor 402. Thus, an increased resistance or capacitance may decrease the Q factor (and thus decrease sensor sensitivity) and vice versa. Higher sensitivity in detection may allow for detection of lighter forces applied to mechanical member 105, and thus may result in a more accurate determination of user interactions with a virtual button associated with mechanical member 105, and may allow for a higher detection resolution allowing for quantification of multiple detection thresholds of forces applied to mechanical member 105. Q factor enhancement may also reduce power consumption associated with detection.

In some embodiments, Q factor enhancer 448 may implement a negative impedance that at least partially cancels an impedance of resistive-inductive-capacitive sensor 402. For example, in some embodiments, Q factor enhancer 448 may implement a negative resistance that at least partially cancels a resistance of resistive-inductive-capacitive sensor 402, in order to increase the effective Q factor of resistive-inductive-capacitive sensor 402. In these and other embodiments, Q factor enhancer 448 may implement a negative capacitance that at least partially cancels a capacitance of resistive-inductive-capacitive sensor 402, in order to increase the effective Q factor of resistive-inductive-capacitive sensor 402. Detection of a Q factor and generation of control signal Q ADJUST are described in greater detail below in connection with discussion of the functionality of DSP 432.

Preamplifier 440 may receive sensor signal $\phi$ and condition sensor signal for frequency mixing, with mixer 442, sensor signal $\phi$ to an intermediate frequency $\Delta f$ combined by combiner 444 with an oscillation frequency generated by VCO 416, as described in greater detail below, wherein intermediate frequency $\Delta f$ is significantly less than the oscillation frequency. In some embodiments, preamplifier 440, mixer 442, and combiner 444 may not be present, in which case PGA 414 may receive sensor signal $\phi$ directly from resistive-inductive-capacitive sensor 402. However, when present, preamplifier 440, mixer 442, and combiner 444 may allow for mixing sensor signal $\phi$ down to a lower frequency intermediate frequency $\Delta f$ which may allow for lower-bandwidth and more efficient ADCs (e.g., ADCs 428 and 430 of FIGS. 4A and 4B and ADC 429 of FIG. 4C, described below) and/or which may allow for minimization of phase and/or gain mismatches in the incident and quadrature paths of the phase detector of processing IC 412A.

In operation, PGA 414 may further amplify sensor signal $\phi$ to condition sensor signal $\phi$ for processing by the coherent incident/quadrature detector. VCO 416 may generate an oscillation signal to be used as a basis for the signal driven by voltage-to-current converter 408, as well as the oscillation signals used by mixers 420 and 422 to extract incident and quadrature components of amplified sensor signal $\phi$. As shown in FIG. 4A, mixer 420 of the incident channel may use an unshifted version of the oscillation signal generated by VCO 416, while mixer 422 of the quadrature channel may use a 90-degree shifted version of the oscillation signal phase shifted by phase shifter 418. As mentioned above, the oscillation frequency of the oscillation signal generated by VCO 416 may be selected based on a resonant frequency of resistive-inductive-capacitive sensor 402 (e.g., may be approximately equal to the resonant frequency of resistive-inductive-capacitive sensor 402).

In the incident channel, mixer 420 may extract the incident component of amplified sensor signal 4, low-pass filter 424 may filter out the oscillation signal mixed with the amplified sensor signal $\phi$ to generate a direct current (DC) incident component, and ADC 428 may convert such DC incident component into an equivalent incident component digital signal for processing by amplitude and phase calculation block 431. Similarly, in the quadrature channel, mixer 422 may extract the quadrature component of amplified sensor signal $\phi$, low-pass filter 426 may filter out the phase-shifted oscillation signal mixed with the amplified sensor signal $\phi$ to generate a direct current (DC) quadrature component, and ADC 430 may convert such DC quadrature component into an equivalent quadrature component digital signal for processing by amplitude and phase calculation block 431.

Amplitude and phase calculation block 431 may include any system, device, or apparatus configured to receive phase information comprising the incident component digital signal and the quadrature component digital signal and based thereon, extract amplitude and phase information.

DSP 432 may include any system, device, or apparatus configured to interpret and/or execute program instructions and/or process data. In particular, DSP 432 may receive the phase information and the amplitude information generated by amplitude and phase calculation block 431 and based thereon, determine a displacement of mechanical member 105 relative to resistive-inductive-capacitive sensor 402, which may be indicative of an occurrence of a physical interaction (e.g., press or release of a virtual button) associated with a human-machine interface associated with mechanical member 105 based on the phase information. DSP 432 may also generate an output signal indicative of the displacement. In some embodiments, such output signal may comprise a control signal for controlling mechanical vibration of linear resonant actuator 107 in response to the displacement.

The phase information generated by amplitude and phase calculation block 431 may be subtracted from a reference phase $\phi_{ref}$ by combiner 450 in order to generate an error signal that may be received by low-pass filter 434. Low-pass filter 434 may low-pass filter the error signal, and such filtered error signal may be applied to VCO 416 to modify the frequency of the oscillation signal generated by VCO 416, in order to drive sensor signal $\phi$ towards reference phase $\phi_{ref}$. As a result, sensor signal $\phi$ may comprise a transient decaying signal in response to a "press" of a virtual button associated with resonant phase sensing system 112A as well as another transient decaying signal in response to a subsequent "release" of the virtual button. Accordingly, low-pass filter 434 in connection with VCO 416 may implement a feedback control loop that may track changes in operating parameters of resonant phase sensing system 112A by modifying the driving frequency of VCO 416.

Furthermore, as described in greater detail below with reference to FIG. 5, DSP 432 may implement a Q factor detector coupled to Q factor enhancer 448 and configured to monitor the Q factor based on phase information and based on amplitude information associated with resistive-inductive-capacitive sensor 402. Furthermore, the Q factor detector in connection with Q factor enhancer 448 may be configured to control the Q factor to maintain the Q factor as measured by the Q factor detector within one or more predetermined thresholds.

Figure 4B:
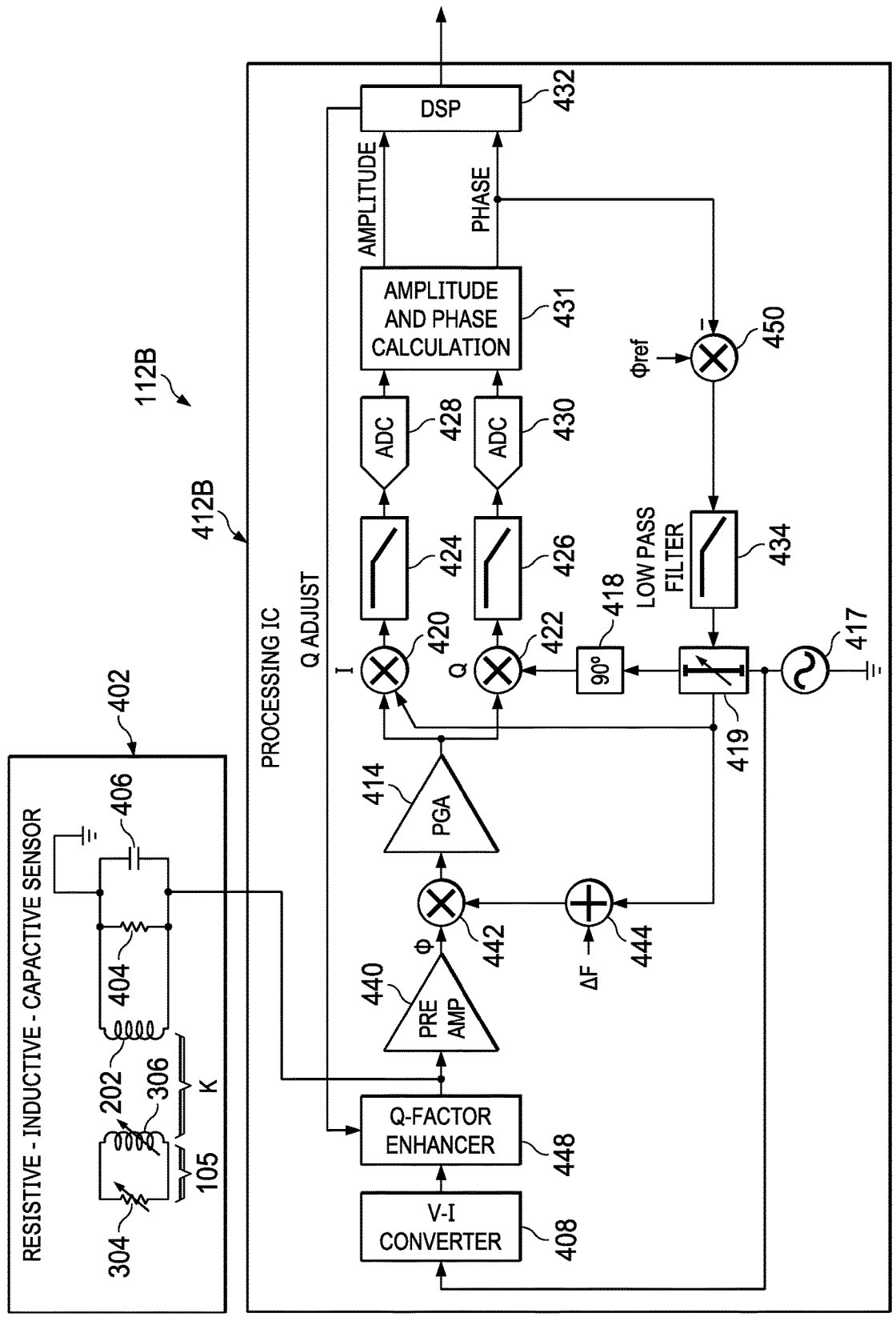

FIG. 4B illustrates a diagram of selected components of an example resonant phase sensing system 112B, in accordance with embodiments of the present disclosure. In some embodiments, resonant phase sensing system 112B may be used to implement resonant phase sensing system 112 of FIG. 1. Resonant phase sensing system 112B of FIG. 4B may be, in many respects, similar to resonant phase sensing system 112A of FIG. 4A. Accordingly, only those differences between resonant phase sensing system 112B and resonant phase sensing system 112A may be described below. As shown in FIG. 4B, resonant phase sensing system 112B may include processing IC 412B in lieu of processing IC 412A. Processing IC 412B of FIG. 4B may be, in many respects, similar to processing IC 412A of FIG. 4A. Accordingly, only those differences between processing IC 412B and processing IC 412A may be described below.

Processing IC 412B may include fixed-frequency oscillator 417 and variable phase shifter 419 in lieu of VCO 416 of processing IC 412A. Thus, in operation, oscillator 417 may drive a fixed driving signal and oscillation signal which variable phase shifter 419 may phase shift to generate oscillation signals to be mixed by mixers 420 and 422. Similar to that of processing IC 412A, low-pass filter 434 may low-pass filter an error signal based on phase information extracted by amplitude and phase calculation block 431, but instead such filtered error signal may be applied to variable phase shifter 419 to modify the phase offset of the oscillation signal generated by oscillator 417, in order to drive sensor signal ϕ towards indicating a phase shift of zero. As a result, sensor signal ϕ may comprise a transient decaying signal in response to a "press" of a virtual button associated with resonant phase sensing system 112B as well as another transient decaying signal in response to a subsequent "release" of the virtual button. Accordingly, low-pass filter 434 in connection with variable phase shifter 419 may implement a feedback control loop that may track changes in operating parameters of resonant phase sensing system 112B by modifying the phase shift applied by variable phase shifter 419.

Figure 4C:
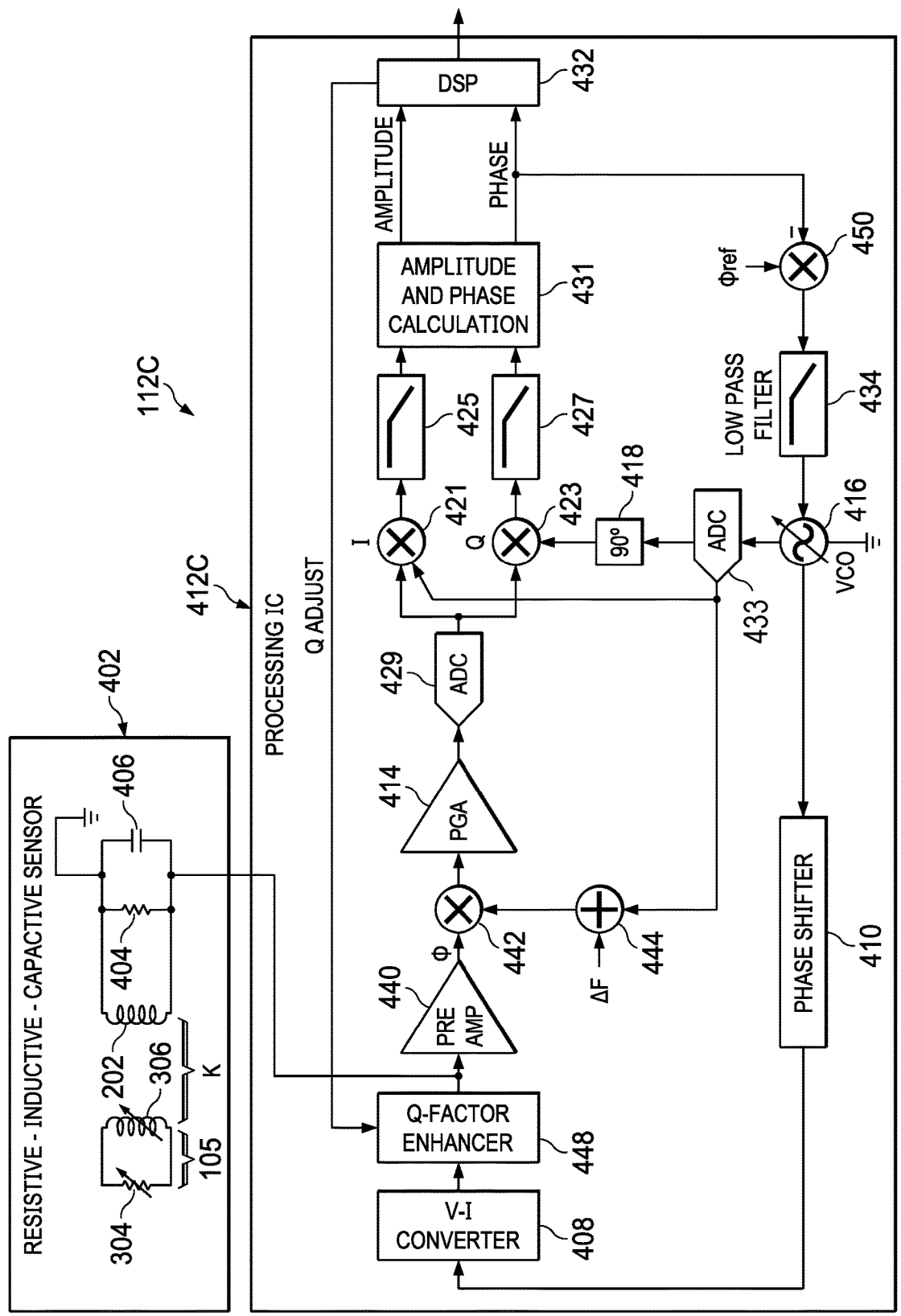

FIG. 4C illustrates a diagram of selected components of an example resonant phase sensing system 112C, in accordance with embodiments of the present disclosure. In some embodiments, resonant phase sensing system 112C may be used to implement resonant phase sensing system 112 of FIG. 1. Resonant phase sensing system 112C of FIG. 4C may be, in many respects, similar to resonant phase sensing system 112A of FIG. 4A. Accordingly, only those differences between resonant phase sensing system 112C and resonant phase sensing system 112A may be described below. For example, a particular difference between resonant phase sensing system 112C and resonant phase sensing system 112A is that resonant phase sensing system 112C may include ADC 429 and ADC 433 in lieu of ADC 428 and ADC 430. Accordingly, a coherent incident/quadrature detector for resonant phase sensing system 112C may be implemented with an incident channel comprising a digital mixer 421 and a digital low-pass filter 425 (in lieu of analog mixer 420 and analog low-pass filter 424) and a quadrature channel comprising a digital mixer 423 and a low-pass filter 427 (in lieu of analog mixer 422 and analog low-pass filter 426) such that processing IC 412C is configured to measure the phase information using such coherent incident/quadrature detector. Although not explicitly shown, resonant phase sensing system 112B could be modified in a manner similar to that of how resonant phase sensing system 112A is shown to be modified to result in resonant phase sensing system 112C.

Figure 5:
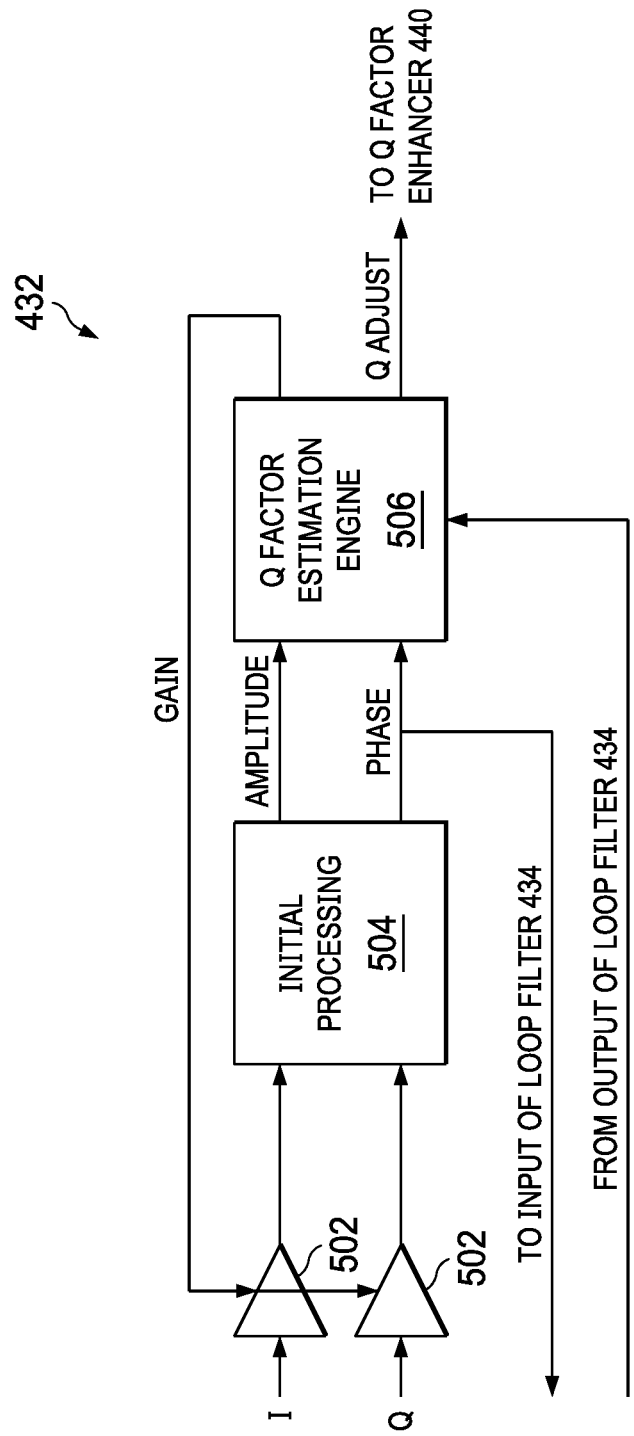
FIG. 5 illustrates a diagram of selected functional components of an example digital signal processor, in accordance with embodiments of the present disclosure.

FIG. 5 illustrates a diagram of selected functional components of an example DSP 432, in accordance with embodiments of the present disclosure. As described in greater detail below, DSP 432 may be configured to implement a Q factor detector (e.g., Q factor estimation engine 506) coupled to Q factor enhancer 448 and configured to monitor the Q factor based on phase information and based on amplitude information associated with resistive-inductive-capacitive sensor 402. Furthermore, the Q factor detector (e.g., Q factor estimation engine 506) in connection with Q factor enhancer 448 may be configured to control the Q factor to maintain the Q factor as measured by the Q factor detector within one or more predetermined thresholds.

As shown in FIG. 5, DSP 432 may include one or more input digital gain elements 502, an initial processing block 504, and a Q factor estimation engine 506. Gain elements 502 may respectively receive the incident component I and the quadrature component Q as generated by a coherent incident/quadrature detector of a processing IC 412, and apply a gain to each of the incident component I and the quadrature component Q in accordance with a control signal GAIN generated by Q factor estimation engine 506, as described in greater detail below.

Initial processing block 504 may receive the incident component I and the quadrature component Q as modified by gain elements 502, and based on such incident component I and the quadrature component Q generate signals indicative of a phase and an amplitude associated with resistive-inductive-capacitive sensor 402.

Q factor estimation engine 506 may implement a Q factor detector and may comprise any suitable system, device, or apparatus communicatively coupled to Q factor enhancer 448 and configured to monitor the Q factor of resistive-inductive-capacitive sensor 402 based on the phase information and based on amplitude information generated by initial processing block 504 and associated with resistive-inductive-capacitive sensor 402. Q factor estimation engine 506 may also be configured to, by generating control signal Q adjust, maintain the Q factor as measured by Q factor estimation engine 506 within one or more predetermined thresholds. To that end, together Q factor estimation engine 506 and Q factor enhancer 448 may implement at least a portion of a control loop that comprises a feedforward path and a feedback path for maintaining the Q factor as measured by Q factor estimation engine 506 within the one or more predetermined thresholds, which may control the Q factor in such a manner so as to prevent oscillation of resistive-inductive-capacitive sensor 402.

In some embodiments, Q factor estimation engine 506 may determine whether the Q factor is within the one or more predetermined thresholds based on at least one or more of a slope of a phase of resistive-inductive-capacitive sensor 402 as indicated by the phase information, an absolute phase of resistive-inductive-capacitive sensor 402 as indicated by the phase information, and/or an amplitude as indicated by the amplitude information. In these and other embodiments, the measurement circuit implemented by resonant phase sensing system 112 (e.g., the coherent incident/quadrature detector) may be configured to account for modification of the Q factor by Q factor enhancer 448 in determining the phase information.

In these and other embodiments, the control loop implemented by Q factor enhancer 448 and Q factor estimation engine 506 may be set at a control loop bandwidth so as to avoid interference with an algorithm (and its associated bandwidth) of the measurement circuit implemented by resonant phase sensing system 112 for determining the displacement of the mechanical member.

Although the foregoing contemplates use of closed-loop feedback for sensing of displacement, the various embodiments represented by FIGS. 4A-4C may be modified to implement an open-loop system for sensing of displacement. In such an open-loop system, a processing IC may include no feedback path from amplitude and phase calculation block 431 to VCO 416 or variable phase shifter 419 and thus may also lack a feedback low-pass filter 434. Thus, a phase measurement may still be made by comparing a change in phase to a reference phase value, but the oscillation frequency driven by VCO 416 may not be modified or the phase shifted by variable phase shifter 419 may not be shifted.

Although the foregoing contemplates use of a coherent incident/quadrature detector as a phase detector for determining phase information associated with resistive-inductive-capacitive sensor 402, a resonant phase sensing system 112 may perform phase detection and/or otherwise determine phase information associated with resistive-inductive-capacitive sensor 402 in any suitable manner, including, without limitation, using only one of the incident path or quadrature path to determine phase information.

In some embodiments, an incident/quadrature detector as disclosed herein may include one or more frequency translation stages that translate the sensor signal into direct-current signal directly or into an intermediate frequency signal and then into a direct-current signal. Any of such frequency translation stages may be implemented either digitally after an analog-to-digital converter stage or in analog before an analog-to-digital converter stage.

In addition, although the foregoing contemplates measuring changes in resistance and inductance in resistive-inductive-capacitive sensor 402 caused by displacement of mechanical member 105, other embodiments may operate based on a principle that any change in impedance based on displacement of mechanical member 105 may be used to sense displacement. For example, in some embodiments, displacement of mechanical member 105 may cause a change in a capacitance of resistive-inductive-capacitive sensor 402, such as if mechanical member 105 included a metal plate implementing one of the capacitive plates of capacitor 406.

Although DSP 432 may be capable of processing phase information to make a binary determination of whether physical interaction associated with a human-machine interface associated with mechanical member 105 has occurred and/or ceased to occur, in some embodiments, DSP 432 may quantify a duration of a displacement of mechanical member 105 to more than one detection threshold, for example to detect different types of physical interactions (e.g., a short press of a virtual button versus a long press of the virtual button). In these and other embodiments, DSP 432 may quantify a magnitude of the displacement to more than one detection threshold, for example to detect different types of physical interactions (e.g., a light press of a virtual button versus a quick and hard press of the virtual button).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   a resistive-inductive-capacitive sensor;
   a measurement circuit communicatively coupled to the resistive-inductive-capacitive sensor and configured to:
      measure phase information associated with the resistive-inductive-capacitive sensor; and
      based on the phase information, determine a displacement of a mechanical member relative to the resistive-inductive-capacitive sensor; and
   a Q factor enhancer communicatively coupled to the resistive-inductive-capacitive sensor and configured to control a Q factor of the resistive-inductive-capacitive sensor.

2. The system of claim 1, wherein the Q factor enhancer implements a negative impedance that at least partially cancels an impedance of the resistive-inductive-capacitive sensor.

3. The system of claim 1, further comprising a Q factor detector coupled to the Q factor enhancer and configured to monitor the Q factor based on the phase information and based on amplitude information associated with the resistive-inductive-capacitive sensor.

4. The system of claim 3, wherein the Q factor enhancer is further configured to control the Q factor to maintain the Q factor as measured by the Q factor detector within one or more predetermined thresholds.

5. The system of claim 4, wherein the Q factor enhancer and the Q factor detector form at least a portion of a control loop that comprises at least one of a feedforward path and a feedback path.

6. The system of claim 5, wherein a bandwidth of the control loop is set to avoid interference with an algorithm of the measurement circuit for determining the displacement of the mechanical member.

7. The system of claim 5, wherein the Q factor detector determines whether the Q factor is within the one or more predetermined thresholds based on at least one or more of a slope of a phase of the resistive-inductive-capacitive sensor as indicated by the phase information, an absolute phase of the resistive-inductive-capacitive sensor as indicated by the phase information, and an amplitude as indicated by the amplitude information.

8. The system of claim 7, wherein the measurement circuit is configured to account for modification of the Q factor by the Q factor enhancer in determining the phase information.

9. The system of claim 5, wherein the control loop controls the Q factor in such a manner to prevent oscillation of the resistive-inductive-capacitive sensor.

10. The system of claim 1, wherein the measurement circuit comprises a coherent incident/quadrature detector and the measurement circuit is configured to measure the phase information using the coherent incident/quadrature detector.

11. A method comprising:
    measuring phase information associated with the resistive-inductive-capacitive sensor;
    based on the phase information, determining a displacement of a mechanical member relative to the resistive-inductive-capacitive sensor; and
    controlling a Q factor of the resistive-inductive-capacitive sensor with a Q factor enhancer communicatively coupled to the resistive-inductive-capacitive sensor.

12. The method of claim 11, wherein the Q factor enhancer implements a negative impedance that at least partially cancels an impedance of the resistive-inductive-capacitive sensor.

13. The method of claim 11, further comprising monitoring the Q factor based on the phase information and based on amplitude information associated with the resistive-inductive-capacitive sensor with a Q factor detector coupled to the Q factor enhancer.

14. The method of claim 13, further comprising controlling, with the Q factor enhancer, the Q factor to maintain the Q factor as measured by the Q factor detector within one or more predetermined thresholds.

15. The method of claim 14, wherein the Q factor enhancer and the Q factor detector form at least a portion of a control loop that comprises at least one of a feedforward path and a feedback path.

16. The method of claim 15, wherein a bandwidth of the control loop is set to avoid interference with an algorithm of the measurement circuit for determining the displacement of the mechanical member.

17. The method of claim 15, further comprising determining, with the Q factor detector, whether the Q factor is within the one or more predetermined thresholds based on at least one or more of a slope of a phase of the resistive-inductive-capacitive sensor as indicated by the phase information, an absolute phase of the resistive-inductive-capacitive sensor as indicated by the phase information, and an amplitude as indicated by the amplitude information.

18. The method of claim 17, further comprising accounting for modification of the Q factor by the Q factor enhancer in determining the phase information.

19. The method of claim 15, wherein the control loop controls the Q factor in such a manner to prevent oscillation of the resistive-inductive-capacitive sensor.

20. The method of claim 11, wherein measuring the phase information comprises measuring the phase information with a coherent incident/quadrature detector.

* * * * *

UNITED STATES PATENT AND TRADEMARK OFFICE
CERTIFICATE OF CORRECTION

| | |
|---|---|
| PATENT NO. | : 11,537,242 B2 |
| APPLICATION NO. | : 16/294217 |
| DATED | : December 27, 2022 |
| INVENTOR(S) | : Das et al. |

It is certified that error appears in the above-identified patent and that said Letters Patent is hereby corrected as shown below:

In the Claims

1. In Column 14, Lines 7-8, in Claim 11, delete "the resistive-inductive-capacitive sensor;" and insert -- a resistive-inductive-capacitive sensor; --, therefor.

2. In Column 14, Line 35, in Claim 16, delete "the measurement circuit" and insert -- a measurement circuit --, therefor.

Signed and Sealed this
Ninth Day of May, 2023

*Katherine Kelly Vidal*

Katherine Kelly Vidal
*Director of the United States Patent and Trademark Office*